United States Patent
Kund et al.

(10) Patent No.: US 7,384,002 B2
(45) Date of Patent: Jun. 10, 2008

(54) CHIP CARD AND CHIP CARD SECURITY DEVICE

(75) Inventors: Michael Kund, Tuntenhausen (DE); Ralf Symanczyk, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 156 days.

(21) Appl. No.: 11/211,085

(22) Filed: Aug. 25, 2005

(65) Prior Publication Data

US 2006/0076413 A1   Apr. 13, 2006

(30) Foreign Application Priority Data

Aug. 27, 2004   (DE) ............... 10 2004 041 626

(51) Int. Cl.
*G06K 19/06* (2006.01)
(52) U.S. Cl. .................. 235/492; 235/451
(58) Field of Classification Search ............ 235/492, 235/451; 361/737, 738
See application file for complete search history.

(56) References Cited

U.S. PATENT DOCUMENTS

| 6,059,191 | A  | * | 5/2000  | Sedlak et al. ............ 235/492 |
| 6,084,796 | A  | * | 7/2000  | Kozicki et al. ............ 365/153 |
| 6,489,759 | B1 | * | 12/2002 | Acharya et al. ............ 323/297 |
| 6,949,453 | B2 | * | 9/2005  | Li ............................ 438/535 |
| 7,018,863 | B2 | * | 3/2006  | Moore et al. ............... 438/95 |
| 2003/0178660 | A1 | * | 9/2003 | Schmid et al. ............ 257/296 |
| 2003/0186481 | A1 |   | 10/2003 | Lung |
| 2004/0158728 | A1 | * | 8/2004 | Kim ........................ 713/194 |
| 2004/0207965 | A1 | * | 10/2004 | Ausserlechner ............ 361/56 |
| 2005/0039949 | A1 | * | 2/2005 | Kosowsky ................ 174/262 |

FOREIGN PATENT DOCUMENTS

| DE | 103 23 414      | 12/2004 |
| DE | 10 2004 018 715 | 11/2005 |

* cited by examiner

Primary Examiner—Ahshik Kim
(74) Attorney, Agent, or Firm—Slater & Matsil, L.L.P.

(57) ABSTRACT

The invention relates to a chip card security device, a procedure to be used in securing a chip card, as well as a chip card (1), comprising:
at least one memory component (11), which comprises an active material layer (13), in particular an active material layer (13) comprising a solid state electrolyte, which layer may be brought into more or less of a conductive state and/or a state exhibiting a higher or lower level of capacitance by means of appropriate switching procedures.

18 Claims, 3 Drawing Sheets

CHIP CARD AND CHIP CARD SECURITY DEVICE

CLAIM FOR PRIORITY

This application claims the benefit of priority to German Application No. 10 2004 041 626.5 which was filed in the German language on Aug. 27, 2004 the contents of which are hereby incorporated by reference.

1. Technical Field

The invention relates to a chip card, in particular a chip card with a security device, a chip card security device, as well as a procedure to be used in securing a chip card.

2. Background

A chip card and/or smart card is a programmable plastic card with one or more chips, to be used for instance in cashless transactions (e.g. as a credit card, EC card, phone card, "electronic cash card", etc.), for operating access control systems, as a pay-TV smart card, for recording patient data, as a membership card, etc., etc., etc.

Conventional chip cards may for instance contain a micro-controller chip as well as for instance one or more memory components—integrated into the same chip for instance as the micro-controller—, in particular semi-conductor memory components, for instance ROM memory components (ROM=Read Only Memory)—in particular PROMs or EEPROMs—and/or RAM memory components (RAM=Random Access Memory), etc.

The chip(s) provided on the chip card (and/or the upper chip surface) may be covered with a suitable protective layer.

Chip cards are finding use in an increasing number of applications.

Because the data stored on a chip card—in particular on its memory components as mentioned above—often comprises data relevant for security, the data needs to be protected against unauthorized access.

In addition any manipulation of the card's method of operation needs to be prevented.

Despite all the chip card security measures used for the above purposes, in the past all the measures in question could repeatedly be "cracked" and—unauthorized—access could be gained to the data stored in the memory components, and/or the operating methods of the chip cards (for instance of phone cards, pay-TV smart cards, etc.) could be manipulated.

To this end the following method(s) have inter alia been used:

i) Non-invasive:
   changing the operating voltage/using voltage spikes to bring the micro-controller into an undefined state;
   over-clocking the chip (also used to place the micro-controller into an undefined state);
   Irradiating with X-rays to erase targeted memory areas and to reset codes;
   X-raying the chip in order to analyze its construction; etc., etc.

ii) Invasive (After Removing the Chip's Security Layer and/or Exposing the Chip Surface):
   Optically reading the ROM memory components (possible for instance with fuse/anti-fuse and ion implantation program procedures);
   Exposure to (UV) light in order to bring the micro-controller into an undefined state;
   Scanning signals present on corresponding chip circuits with the help of contact pins and subsequent analysis of those signals;
   Detecting chip voltage signals by means of an REM procedure; etc., etc.

Such procedures are for instance described in J. Wagner: "Leistungsfaehigkeit von Chipkarten (Smart Cards)", Course 2319, Communications Technology, Hagen Correspondence University, Hagen (1998), as well as for instance in J. Posegga: Smartcards, Summer School: "Sicherheit in Netzen und verteilten Systemen", Braunschweig Technical University (2003).

To protect chip card data against unauthorized access and/or chip cards against manipulation, suitable conventional light and/or heat sensors may for instance be used, with which it may for instance be detected that the chip security layer has been removed and/or the chip surface has been exposed in order to perform the invasive chip card data access and/or chip card manipulation procedures described above.

One disadvantage is that the sensor areas are relatively easy to detect so that the protective measures provided by the sensors may therefore be relatively easily by-passed.

In the state of the art technology so-called "resistive" and/or "resistive switching" memory components, for instance so-called phase-change memories, PMC memories (PMC=Programmable Metallization Cell), CB memories (CB=Conductive Bridging), etc. have—recently—become common knowledge.

With "resistive" and/or "resistive switching" memory components, an "active" material—placed for instance between two corresponding electrodes (i.e. an anode and a cathode)—is brought into a more or less conductive state by means of suitable switching procedures (more accurately: by means of appropriate current—or voltage—pulses of suitable amplitude and duration). Here for instance the more conductive state corresponds with a logic "one" and the less conductive state with a stored logic "zero", or vice versa.

With so-called multi-level storage procedures, more than 1 bit (for instance 2, 3, or 4 bits) per cell may be stored in the form of several different resistive states of the active material (achieved by means of suitable current—or voltage—pulses), whereby each resistive state has a corresponding bit to be stored allocated to it.

With Programmable Metallization Cell (PMC) or Conductive Bridging (CB) memories as an "active" material placed between two corresponding electrodes for instance a suitable chalcogenide or chalcogenide compound (for instance GeSe, GeS, AgSe, CuS, etc.) may be used.

In PMC and CB memories the switching process is based on—by applying suitable current and/or voltage pulses of a suitable amplitude and duration—the continuing growth in volume of corresponding elements of a precipitated "cluster" (for instance Ag or Cu or similar compounds) in the active material disposed between the two electrodes, and/or the forming of new clusters, until the two electrodes are finally conductively "bridged", i.e. are conductively connected with each other (the cell is in a conductive state).

By applying correspondingly inverted current pulses this process may be reversed again, whereby the corresponding cell may be returned to a non-conductive state.

SUMMARY

The invention is aimed at providing a novel chip card, in particular a chip card with a security device, a novel chip card security device, as well as a novel procedure to be used in securing a chip card.

It achieves these and other aims by means of the subject matters of claims 1, 8 and 10.

Advantageous further developments of the invention are listed in the subsidiary claims.

In terms of a basic concept of the invention a chip card is made available comprising:

at least one memory component, which comprises an active material layer, in particular an active material layer comprising a solid state electrolyte, which can be brought into more or less of a conductive state and/or a state exhibiting a higher or lower level of capacitance by means of appropriate switching procedures.

Advantageously the memory component—correspondingly similar to conventional (P)ROMs, EEPROMs, or RAMs—can be used as chip-card data memory and/or as chip-card security device and/or part of such a device.

BRIEF DESCRIPTION OF THE DRAWINGS

Below, the invention is more closely described by means of several embodiment examples and the attached illustration. In the illustration.

DETAILED DESCRIPTION

Figure 1:
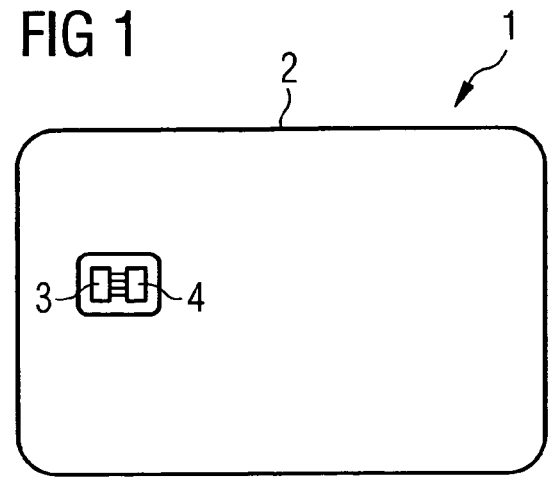
FIG. 1 is a schematic representation of a chip card in terms of an embodiment example of the above invention.

In FIG. 1—shown schematically and as an example—the construction of a chip card 1 and/or smart card in terms of an embodiment example of the invention is shown.

This chip card—correspondingly similar to conventional chip cards—has a base 2 of plastic, as well as a micro-controller 3, and—electrically connected with it—a memory device 4. Alternatively the memory device 4 may also be integrated in the micro-controller 3.

The chip card 2 with its micro-controller 3/memory device 4 may be designed to be relatively thin (for instance with a thickness of less than 0.2 cm or 0.1 cm), and for instance a length of less than 12 cm and for instance longer than 6 cm (or for instance smaller than 8 cm, etc.), and for instance with a width narrower than 8 cm and for instance wider than 4 cm (or for instance narrower than 6 cm, etc.).

The chip card 2 could for instance be used—depending on how it has been programmed—for cashless transactions (for instance as a credit card, EC card, phone card, "electronic cash" card, etc.), for operating access control systems, as a pay-TV "smart card", for the storage of patient data, as a membership card, etc.

The function of semi-conductor memory components provided—in conventional chip cards—as a memory device, for instance ROM memory components (ROM=Read Only Memory and/or permanent memory)—in particular PROMs and/or EEPROMs, and/or RAM-memory components (RAM=Random Access Memory and/or read-write memories), etc. may—as is more closely described below—in the embodiment example dealt with here, be partly or in its entirety performed by "resistive switching" memory cells (on which the useful and/or controlling data (or a part of it) for operating the chip card 1—for instance the corresponding program command data of a software program to be executed by the micro-controller 3 and/or corresponding variable constants, etc.) may be stored.

In an alternative embodiment—not shown here—one or more further memory devices have been provided in addition to the above memory device 4 containing resistive switching memory cells—correspondingly similar to conventional chip cards—which may contain suitable semi-conductor memory components, for instance ROM memory components, in particular PROMs and/or EEPROMs, and/or RAM-memory components, etc., on which the remaining part of the useful and/or control data for the functioning of the chip card 1 (or—in cases where the resistive switching memory cells are simply used as a chip card security device (see below)—all useful and/or control data) may be stored.

The micro-controller 3 and the memory device 4 may be separately arranged—lying on different substrates—or may be integrated on the same substrate (for instance suitably doped silicon or germanium).

The memory device 4 and/or the further memory device—where additionally provided—may for instance have a memory capacity larger than 61 or 128 kilobits, in particular larger than 1 megabit.

The micro-controller 3 and the memory device(s) 4 (and/or their upper surfaces) may be covered—on top—by a suitable opaque and/or heat isolating and/or electrically non-conductive protective layer (for instance by a suitable plastic layer).

As already described above, resistive switching memory cells 11, lying on one and the same substrate (for instance suitably doped silicon or germanium)—used in each case as data memories and/or a chip card security device—have been provided on the memory device 4.

Figure 2:
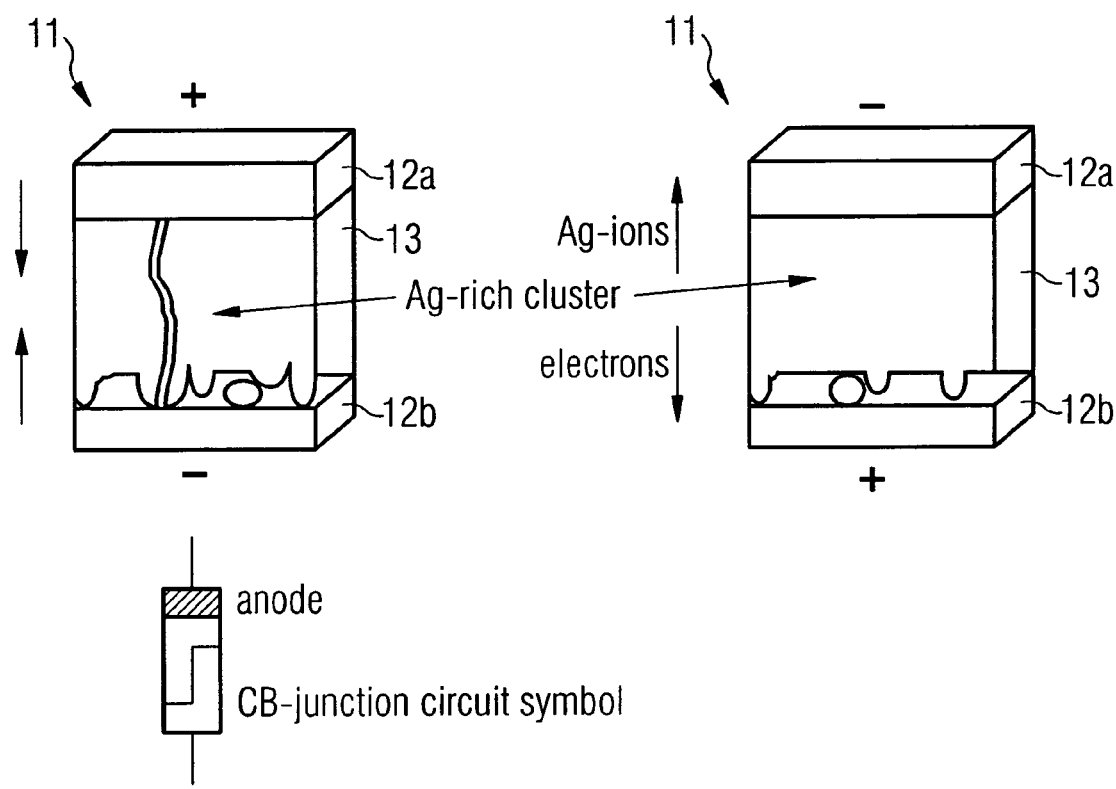
FIG. 2 is a schematic representation of a resistive switching memory cell in two different switching states used in the memory device of the chip card shown in FIG. 1.

In each case the memory cells 11—as illustrated in FIG. 2—contain two corresponding metal electrodes 12a, 12b (i.e. an anode, and a cathode).

Between the electrodes 12a, 12b a corresponding "active" material layer 13 has been placed, which may for instance be surrounded by a suitable layer of isolating material.

The material layer 13 may be brought into more or less of a conductive state (whereby for instance the more conductive state corresponds with a stored logic "one" (shown on the left in FIG. 2) and the less conductive state with stored logic "zero" (shown on the right in FIG. 2), or vice versa) by means of appropriate switching procedures (in particular by applying corresponding current or voltage pulses of an appropriate level and duration to the metallic electrodes 12a, 12b).

The memory cell 11 may for instance be a PMC (PMC=Programmable Metallization Cell) memory cell, or a CB (CB=Conductive Bridging) memory cell.

The material for the active material layer 13 may for instance be a suitable chalcogenide (for instance GeSe, GeS, AgSe, CuS, etc.) and—for one of the electrodes, for instance the electrode 12a, Cu, Ag, Au, Zn, etc., may be used and—for the other electrode 12b—for instance W, Ti, Ta, TiN, etc.

Figure 3:
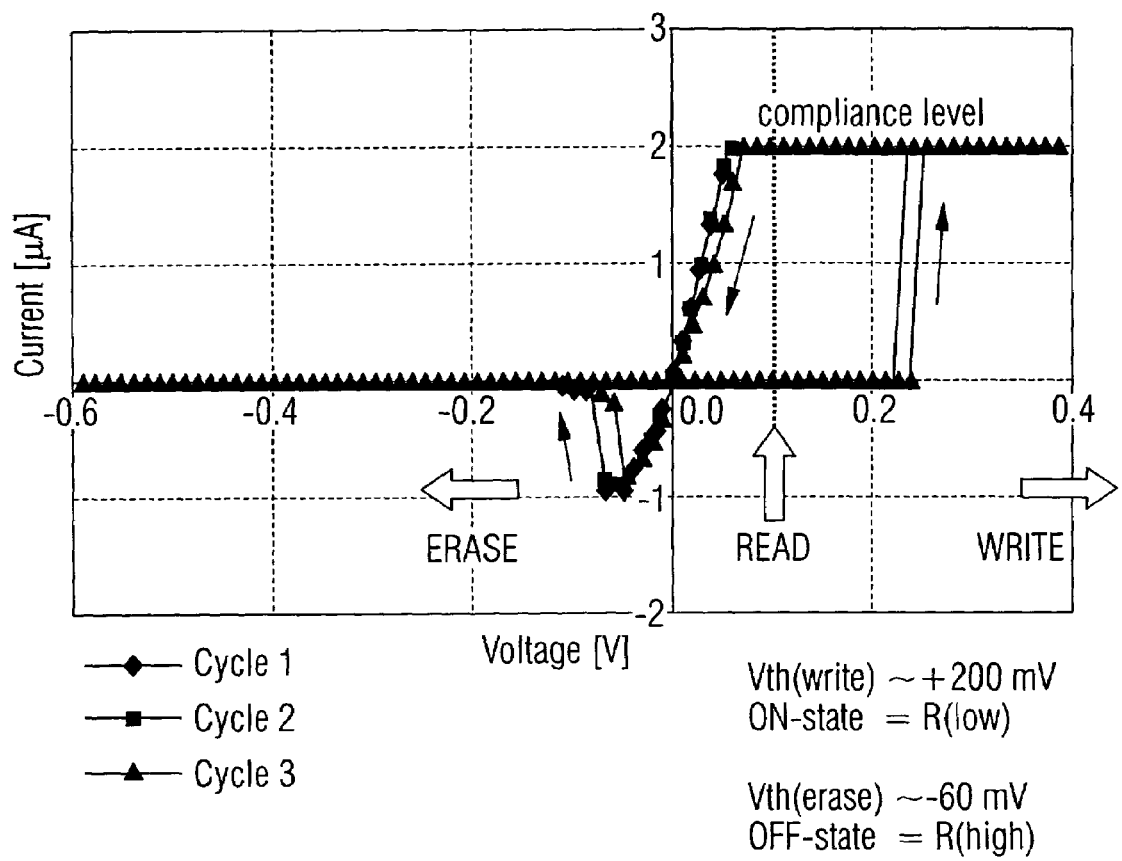
FIG. 3 is a current/voltage diagram to illustrate the switching characteristics and/or the switching behavior of the memory cell shown in FIG. 2.

The switching procedure for the memory cells 11 depends thereon that—by applying an appropriate current and/or voltage pulse at a suitable level and (for instance in terms of FIG. 3 a voltage $V_{th(write)}$ of ca. +200 mV) to the metallic electrodes 12a, 12b—corresponding precipitated "clusters"

in the active material layer 13 Cu—, Ag—, Au—, or Zn—, etc.) continue to increase in volume and/or are newly created, so that the two electrodes 12a, 12b are finally conductively "bridged", i.e. are conductively connected with each other (cf. the conductive state of the CB memory cell 11 shown on the left in FIG. 2).

By applying correspondingly inverted current and/or voltage pulses (for instance, in terms of FIG. 3 a voltage $V_{th(erase)}$ of ca. −60 mV) to the metallic electrodes 12a, 12b, this process may be reversed again, whereby the corresponding memory cell 11 may be returned again to a non-conductive state (cf. the state of the memory cell 11, shown on the right in FIG. 2).

Figure 4:
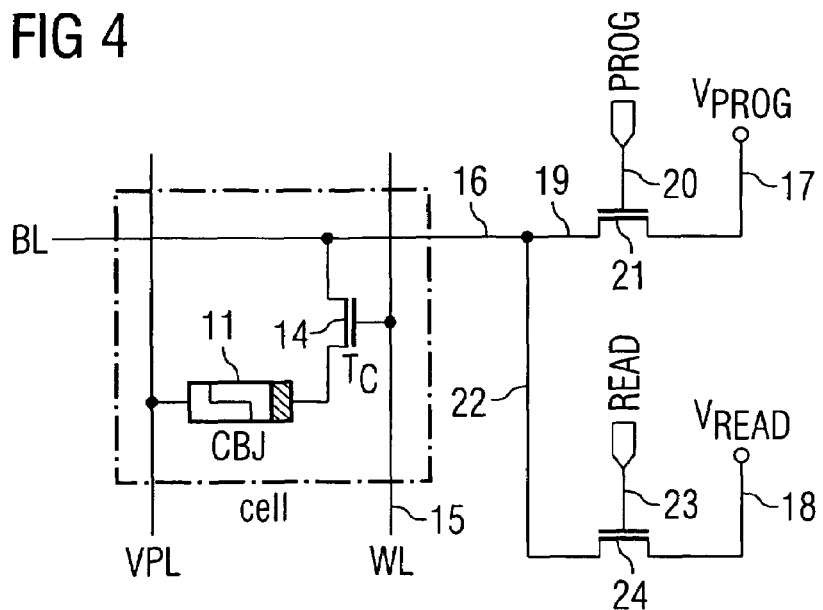
FIG. 4 is a schematic circuit diagram to illustrate the circuitry of a memory cell of the chip card used as a data memory.

As is apparent from FIG. 4, the resistive switching memory cells 11 (in particular the memory cells 11 used for data storage) provided in the memory device 4 of chip card 1 may in each case be controlled or activated by a single transistor 14 allocated to each cell 11 and/or contained in it.

In order to achieve this, a high logic signal is applied to a control line 15 connected with a control input of the transistor 14 (here: with a word line WL), whereby the transistor 14 is brought into a conductive state.

Hereby the electrode 12a (here: the anode) of the memory cell 11 is again conductively connected with a line 16.

The line 16 (and thereby also the electrode 12a) is connected via a line 19 connected with line 16 with the corresponding programming voltage $V_{prog}$ ($|V_{prog}|$> $|V_{th(write)}|$ and/or $|V_{th(erase)}|$) present on a 17—in order to program the memory cell 11 (i.e. to cause a change in its state from being non-conductive to being conductive ("write"), and/or from conductive to non-conductive ("erase").

To achieve this, an appropriate high logic programming signal is applied to control line 20 connected with a control input of a transistor 21, whereby the transistor 21 is brought into a conductive state.

Depending on the programming conditions (i.e. the level and/or duration and/or frequency) of the voltages/currents applied to the electrodes 12a, 12b of the memory cell 11, it may—optionally—be operated with correspondingly different memory characteristics, for instance—optionally—either in accordance with the operating method of a conventional (P)ROM or an EEPROM, and/or—optionally—as a volatile or non-volatile memory and/or—optionally—as a reversible or irreversible memory, etc.

In order to read the current state of the memory cell 11 (i.e. to test whether it is in a conductive or a non-conductive state) line 16 (and thereby the electrode 12a) is connected via line 22 connected with line 16 with the corresponding read voltage $V_{read}$ present on line 18 (with $|V_{read}|$< $|V_{th(write)}|$).

In order to achieve this, a corresponding high logic "read" signal is applied to a control line 23 connected with a control input of a transistor 24, whereby the transistor 24 is brought into a conductive state.

Depending on whether—in reaction to the read voltage $V_{read}$ being applied—correspondingly much or little and/or no current flows through the memory cell 11, it can be detected whether the latter is in more or less of a conductive state (i.e. in a state of a stored logic "one", or a stored logic "zero").

As mentioned already, a few or several of the above resistive switching memory cells 11 provided on the chip card 1, in particular on the memory device 4, may be used as chip card security devices. The memory cell(s) 11—used as chip card security devices—may be arranged to lie together with the remaining memory cells 11 in a regular memory cell matrix structure (i.e. in corresponding memory cell rows and columns) so that it is impossible or difficult to recognize whether a memory cell is operating as a chip card security device or as a data memory.

Figure 5:
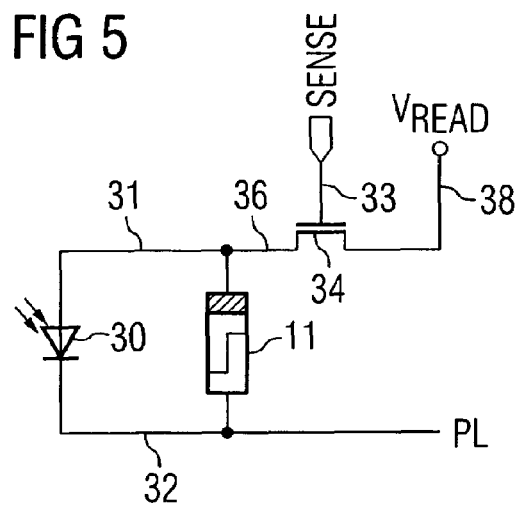
FIG. 5 is a schematic circuit diagram to illustrate a first variation of the circuitry of a memory cell of the chip card, used as a chip card security device.

In FIG. 5 a schematic circuit diagram is shown to illustrate a first version of the circuitry of a memory cell 11—used as a chip card security device—of the chip card 1.

The memory cell 11—used as a chip card security device—is first brought into a permanent (i.e. non-volatile) conductive state and/or "written", in particular before the memory device 4 and/or the micro-controller 3 is built into the chip card 1 (and before the micro-controller 3 and/or the memory device 4 (and/or their upper surfaces) is covered with the protective layer) by applying appropriate current and/or voltage pulses of an appropriate level and duration (for instance—in terms of FIG. 3—a voltage of $V_{th(write)}$ of ca. +200 mV) to the metallic electrodes 12a, 12b.

Alternatively the cell 11 may also be written after installation in the chip card 1, and before the chip card 1 is released and/or put into use. Then an additional measure must be provided, which—after the chip card 1 has been released—must prevent any subsequent intentional changes to the state of cell 11. This may for instance be done by interrupting the printed circuits required for writing, for instance by using suitable fusing technology.

As is apparent from FIG. 5, a photodiode 30 is connected in parallel with the memory cell 11—used as a chip card security device—and lying on the same substrate as the memory cell 11.

This photodiode is connected—via a line 31—with the electrode 12a (i.e. the anode) of the memory cell 11, and—via a line 32—with the electrode 12b (i.e. the cathode) of the memory cell 11.

If—during an attempt to gain unauthorized access to the chip card data and/or to perform an unauthorized manipulation of the chip card—the above protective layer is damaged or removed, light falls on the photodiode 30, which may for instance be mounted directly on the upper surface of the memory device 4.

Hereby a current and/or voltage signal is applied to the electrodes 12a, 12b of the memory cell 11 by the photodiode 30—via the lines 31, 32—which causes the memory cell 11 to be permanently returned to a non-volatile, i.e. an irreversible non-conductive state and/or to be "erased".

This is possible because relatively low threshold voltages, for example voltages lying between just +50 mV and +100 mV, are required for this (cf. for instance the erasing voltage $|V_{th(erase)}|$ of ca. +60 mV shown in FIG. 3).

The same effect—the generation of suitable erasing current and/or erasing voltage pulses by the photo diode 30, and the permanent, i.e. non-volatile and irreversible erasure of the memory cell 11—is (alternatively or additionally) achieved when, during an attempt to gain unauthorized access to chip card data and/or an unauthorized attempt to manipulate the chip card 1 and/or the micro-controller 3/memory device 4, the chip card is irradiated with some radiation other than light, for instance with X-rays, (and in fact even with many types of irradiation, when the manipulation is done non-invasively, and—in contrast to what is described above—when the photodiode 30 is not mounted directly on the upper surface of the memory device 4, i.e. is not—even after the protective layer has been removed—visible from the outside).

If necessary, an additional conversion layer may be provided in the photodiode 30, which increases the voltage-generating effect for other types of irradiation than for instance light. In the case of X-rays for instance, amorphous selenium may be used for this purpose.

When operating the chip card 1, it may then be determined—for instance under control of the micro controller 3, or a separate chip-card security control device—for instance before each access to a corresponding chip card function, or for instance at regular intervals, or for instance before each action that is to be performed, or for instance always at the start of the chip card operation (i.e. after an appropriate external operating voltage has been applied) etc., etc.— whether the state of the memory cell 11 as described above has changed from "conductive" and/or "written" to "non-conductive" and/or "erased" due to unauthorized chip card data access and/or unauthorized chip card manipulation.

To this end, a line 36 connected with electrode 12a (i.e. the anode)—and thereby the electrode 12a—is connected with a corresponding read voltage $V_{read}$ present on line 38.

For this, a corresponding high logic state scanning activation signal is applied to a control line 33 connected with a control input of a transistor 34, whereby the transistor 34 is brought into a conductive state.

Depending on whether—in reaction to the application of the read voltage $V_{read}$—relatively correspondingly much or little and/or no current flows through the memory cell 11, it can be detected—for instance by means of the micro-controller 3 and/or the separate chip card security control device—that the memory cell 11 is in a conductive (i.e. written), or non-conductive (i.e. erased) state.

If it is determined that the memory cell 11 is in a non-conductive, i.e. in an erased state, this confirms that unauthorized chip card data access and/or an unauthorized chip card manipulation has taken place; the chip card 1 is then brought into a "blocked" state by the micro-controller 3 and/or the separate chip card security control device, whereby the operation of the chip card 1 is—at least temporarily—interrupted and/or finally—and permanently—rendered impossible.

Figure 6:
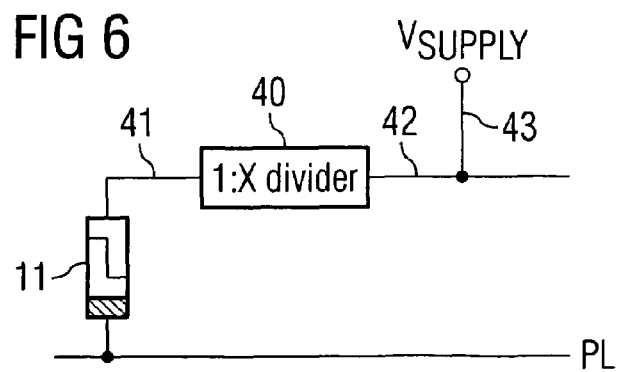
FIG. 6 is a schematic circuit diagram to illustrate a further variation of the circuitry of a memory cell of the chip card, used as a chip card security device.

In FIG. 6 a schematic circuit diagram is shown to illustrate a further version (as an alternative or in addition to the first version used in the memory device 4 described above) of a memory cell 11—used as a chip card security device— of the chip card 1.

The memory cell 11—corresponding with the memory cell 11 shown in FIG. 5—is for instance brought into a permanent (i.e. non-volatile) conductive state and/or "written" in advance, in particular before installing the memory device 4 and/or the micro-controller 3 in the chip card 1 (and before covering the micro-controller 3 and/or the memory device 4 (and/or their upper surfaces) with the above protective layer) by applying appropriate current and/or voltage pulses.

Alternatively—correspondingly similar to that described above with reference to FIG. 5—the cell 11 may also be written after being installed in chip card 1, and before chip card 1 is released and/or put into use. In addition, another device must then be provided, which must—after the chip card 1 has been released—prevent any subsequent change to the state of cell 11, for instance a corresponding fuse device, with which an interruption in the circuits necessary for writing cell 11 may be caused.

As is apparent from FIG. 6, the memory cell 11—used as chip card security device—is connected in series with a voltage splitter device 40—lying on the same substrate as the memory cell 11.

The voltage splitter device 40 is connected—via a line 41—with the electrode 12b (i.e. with the cathode) of the memory cell 11, and—via a line 42—with a line 43, to which an appropriate external operating voltage $V_{supply}$ is applied when the chip card 1 is put into use (at a pre-determined voltage at a level specified for the normal operation of chip card 1). The line 43—and thereby also the external operating voltage $V_{supply}$—is connected with several elements of the memory device 4 and/or the micro-controller 3, which need to be provided with the operating voltage $V_{supply}$.

The voltage splitter device 40 divides the external operating voltage $V_{supply}$ present on line 43 in such a way that a voltage $V_{supply}:X$, which has been reduced in relation to the external operating voltage $V_{supply}$, is applied—via line 41—by the voltage splitter device 40 to the memory cell 11 (and/or its electrode 12b).

The voltage splitter device 40 is arranged in such a way, that—during the normal operation of the chip card 1, in which the external operating voltage $V_{supply}$ is at the above predetermined voltage level—the level of the voltage $V_{supply}:X$—applied by the voltage splitter device 41 to the memory cell 11—is lower than the voltage ("threshold voltage $V_{th(erase)}$) necessary for erasing the memory cell 11, for instance more than 10% or more than 20% lower (for instance lower than +50 mV, in particular for instance lower than +30 mV, etc.).

When—during an attempt to gain unauthorized access to a chip card's data and/or to perform an unauthorized chip card manipulation—relatively high voltages and/or corresponding voltage peaks are applied to the chip card 1 (in particular when a voltage is applied to line 43, which is higher than the above operating voltage $V_{supply}$) a current— and/or a voltage pulse—which is so high (for instance between +50 mV and +100 mV, i.e. equal to or higher than the threshold voltage $|V_{th(erase)}|$)—is applied by the voltage splitter device 40 via line 41 to the electrodes 12a, 12b of the memory cell 11, that the memory cell 11 is brought back permanently to a non-volatile, i.e. an irreversible non-conductive state and/or "erased".

When operating the chip card 1, it may be determined— for instance in a correspondingly similar fashion to that described above in relation to FIG. 5—for instance before each access to a corresponding chip card function, or for instance at regular intervals, or for instance before each action that is to be performed, or for instance always at the start of the chip card operation (i.e. after an appropriate external operating voltage has been applied) etc., etc.— whether the state of the memory cell 11 illustrated in FIG. 6 has, as described above, changed from "conductive" and/or "written" to "non-conductive" and/or "erased" due to unauthorized chip card data access and/or unauthorized chip card manipulation.

If it is determined that the memory cell 11 is in a non-conductive, i.e. in an erased state, this is an indication that unauthorized chip card data access and/or an unauthorized chip card manipulation has taken place; the chip card 1 is then brought into a "blocked" state by the micro-controller 3 and/or the separate chip card security control device, whereby the operation of the chip card 1 is at least temporarily—interrupted and/or finally and permanently rendered impossible.

| | |
|---|---|
| 1 | Chip card |
| 2 | Plastic base |
| 3 | Micro-controller |
| 4 | Memory device |
| 11 | Memory cell |
| 12a | Electrode |

| | |
|---|---|
| 12b | Electrode |
| 13 | Active material layer |
| 14 | Transistor |
| 15 | Control line |
| 16 | Line |
| 17 | Line |
| 18 | Line |
| 19 | Line |
| 20 | Control line |
| 21 | Transistor |
| 22 | Line |
| 23 | Control line |
| 24 | Transistor |
| 30 | Photodiode |
| 31 | Line |
| 32 | Line |
| 33 | Control line |
| 34 | Transistor |
| 38 | Line |
| 40 | Voltage splitter device |
| 41 | Line |
| 42 | Line |
| 42 | Line |

The invention claimed is:

1. A chip card, comprising:
a chip card security device for protection of the chip card, the chip card security device including at least one memory component, which comprises an active material layer, which can be brought into a state exhibiting a higher or lower level of capacitance by means of appropriate switching procedures upon detection of an unauthorized access of the chip card, wherein the chip card security device comprises a voltage splitter circuit working in conjunction with the memory component.

2. The chip card according to claim 1, wherein the active material layer comprises a solid state electrolyte.

3. The chip card according to claim 1, wherein the active material layer comprises a chalcogenide and/or a chalcogenide compound.

4. The chip card according to claim 1, wherein the memory component is a CB (Conductive Bridging) or PMC (Programmable Metallization Cell) memory component.

5. A chip card security device to be used in a chip card, the chip card security device comprising a memory component with an active material layer, which may be brought into a state exhibiting a higher or lower level of conductance by means of appropriate switching procedures upon detection of an unauthorized access of the chip card, the active material layer comprising a chalcogenide and/or a chalcogenide compound.

6. The chip card according to claim 5, wherein the chip card security device comprises a radiation detection device working in conjunction with the memory component.

7. The chip card according to claim 6, wherein the radiation detection device comprises a photodiode.

8. The chip card according to claim 5, wherein the chip card security device comprises a voltage splitter circuit working in conjunction with the memory component.

9. The chip card security device according to claim 5, wherein the active material layer comprises a solid state electrolyte.

10. A method to be used in securing a chip card, which chip card comprises a memory component, the method comprising:
detecting an unauthorized attempt to access the chip card;
in response to detecting the unauthorized attempt, causing a state of the memory component to exhibit a higher or lower level, wherein the memory component is a CB (Conductive Bridging) or PMC (Programmable Metallization Cell) memory component; and
blocking the chip card dependent on the state of the memory component.

11. The method according to claim 10, wherein detecting an unauthorized attempt comprises detecting an opening of a package that houses the chip card.

12. The method according to claim 11, wherein detecting an opening comprises detecting an opening of the package using a radiation detection device.

13. The method according to claim 10, wherein causing a state of the memory component to exhibit a higher or lower level comprises causing the state of the memory component to exhibit a higher or lower level of capacitance.

14. A chip card comprising:
a chip card controller;
a sensor configured to determine an unauthorized access to the chip card wherein the sensor comprises a radiation sensing device comprising a photodiode; and
a memory component coupled to the chip card controller and the sensor, wherein upon an indication of an unauthorized access from the sensor, the memory component changes state so as to disable the chip card controller.

15. The chip card of claim 14, wherein the chip card controller comprises a micro-controller.

16. A chip card comprising:
a chip card controller;
a sensor configured to determine unauthorized access to the chip card, wherein the sensor comprises a voltage divider; and
a memory component coupled to the chip card controller and the sensor, wherein upon an indication of the unauthorized access from the sensor, the memory component changes state so as to disable the chip card controller and wherein the memory component comprises an active material layer comprising a chalcogenide and/or a chalcogenide compound.

17. The chip card of claim 16, wherein the memory component comprises an active material layer comprising a solid state electrolyte.

18. A chip card comprising:
a chip card controller;
a sensor configured to determine unauthorized access to the chip card; and
a memory component coupled to the chip card controller and the sensor, wherein upon an indication of the unauthorized access from the sensor, the memory component changes state so as to disable the chip card controller, and wherein the memory component comprises an active material layer comprising a chalcogenide and/or a chalcogenide compound.

* * * * *